US011262390B2

(12) United States Patent
Nagao et al.

(10) Patent No.: US 11,262,390 B2
(45) Date of Patent: Mar. 1, 2022

(54) POWER CONSUMPTION CALCULATION APPARATUS, POWER CONSUMPTION CALCULATION METHOD AND PROGRAM

(71) Applicant: NIPPON TELEGRAPH AND TELEPHONE CORPORATION, Tokyo (JP)

(72) Inventors: Tomomi Nagao, Musashino (JP); Atsushi Sakurai, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 15/734,708

(22) PCT Filed: May 13, 2019

(86) PCT No.: PCT/JP2019/018896
§ 371 (c)(1),
(2) Date: Dec. 3, 2020

(87) PCT Pub. No.: WO2019/235140
PCT Pub. Date: Dec. 12, 2019

(65) Prior Publication Data
US 2021/0223299 A1 Jul. 22, 2021

(30) Foreign Application Priority Data
Jun. 4, 2018 (JP) .............................. JP2018-107055

(51) Int. Cl.
*G01R 21/00* (2006.01)
*G06Q 50/06* (2012.01)

(52) U.S. Cl.
CPC ........... *G01R 21/007* (2013.01); *G06Q 50/06* (2013.01)

(58) Field of Classification Search
CPC .................................................... G01R 21/007
(Continued)

(56) References Cited

U.S. PATENT DOCUMENTS 9,008,980 B2 * 4/2015 Takakura .............. G06F 11/323 702/61
2011/0126206 A1 * 5/2011 Kato ....................... G06F 9/505 718/103

(Continued)

FOREIGN PATENT DOCUMENTS

JP 6023022 11/2016

OTHER PUBLICATIONS

Tokuhiro Sugiura, "Visualization of Air Conditioning Efficiency by Analyzing of Power Consumption of Server Room", Journal for Academic Computing and Networking, No. 19, pp. 12-18, 2015.

*Primary Examiner* — Ricky Go
(74) *Attorney, Agent, or Firm* — IPUSA, PLLC

(57) ABSTRACT

A power consumption calculation apparatus identifies, from a history of a total power consumption Wx measured at a facility including power supply equipment, air conditioning equipment, and communication equipment; identifies, for each Wx, an air conditioning efficiency Ra; calculates a power consumption Wc' in a second area excluding a first area in the facility by applying each Wx and Ra to a relation Wc+Wa+(Wx×Rp)=Wx where Ra is calculated by dividing Wa being a power consumption of the communication equipment by Wa being a power consumption of the air conditioning equipment and Rp is a loss factor of Wx; and calculates a power consumption of the first or second area based on Wx corresponding to a second period in the history, Wc', Rp, and an air conditioning efficiency Ra' corresponding to the second period.

7 Claims, 5 Drawing Sheets

(58) Field of Classification Search
USPC .......................................................... 702/60
See application file for complete search history.

(56) References Cited

U.S. PATENT DOCUMENTS

| | | | |
|---|---|---|---|
| 2013/0345998 A1* | 12/2013 | Matsubara | G06Q 10/04 |
| | | | 702/60 |
| 2014/0074444 A1* | 3/2014 | Hamann | G06F 30/13 |
| | | | 703/2 |
| 2017/0168552 A1* | 6/2017 | Mishina | G05B 19/41865 |

* cited by examiner

| OUTSIDE TEMPERATURE (°C) | AIR CONDITIONING EFFICIENCY Ra |
|---|---|
| ... | ... |
| ... | ... |
| ... | ... |

Fig. 5

POWER CONSUMPTION CALCULATION APPARATUS, POWER CONSUMPTION CALCULATION METHOD AND PROGRAM

TECHNICAL FIELD

The present invention relates to a power consumption calculation apparatus, a power consumption calculation method, and a program.

BACKGROUND ART

In a facility such as a data center in which communication equipment is operated, in a case where multiple communication services are provided in a mixed manner and the total power consumption of the facility is recorded, the power consumption of each communication service, power supply equipment, and air conditioning equipment can be determined from information such as the quantity of equipment (PTL1).

CITATION LIST

Patent Literature

PTL1: Japanese Patent No. 6023022

Non Patent Literature

NPL1: Tokuhiro Sugiura, "Visualization of Air Conditioning Efficiency by Analyzing of Power Consumption of Server Room", Journal for Academic Computing and Networking, No. 19, pp. 12-18, 2015

SUMMARY OF THE INVENTION

Technical Problem

In a facility that has both a space in which communication equipment is operated (hereinafter, referred to as a "machine room space") and an office space, the total power consumption of the facility may be recorded. In this case, it is difficult to determine the power consumption of each of the machine room space and the office space in accordance with PTL1, which is on the assumption that all the power is consumed in the machine room space.

In light of the foregoing, an object of the present invention is to make it possible to determine the power consumption of a specific area in a facility.

Means for Solving the Problem

In order to solve the above problems, a power consumption calculation apparatus includes: a first identification unit configured to identify, from a history of a total power consumption Wx measured at a facility including power supply equipment, air conditioning equipment, and communication equipment, a part of Wx in an ascending order; a second identification unit configured to identify, for each identified Wx, an air conditioning efficiency Ra corresponding to a temperature at a location of the facility in a first period in which the Wx is measured; a first calculation unit configured to calculate a power consumption Wc' of the communication equipment in a second area excluding a first area in the facility by applying each Wx identified by the first identification unit and each Ra identified by the second identification unit to a relation Wc+Wa+(Wx×Rp)=Wx where the air conditioning efficiency Ra is a value calculated by dividing the WC being a power consumption of the communication equipment by the Wa being a power consumption of the air conditioning equipment and the Rp is a loss factor of the Wx by the power supply equipment; and a second calculation unit that calculates a power consumption of the first area or the second area based on the Wx corresponding to a second period in the history, the Wc', the Rp, and an air conditioning efficiency Ra' corresponding to the second period.

Effects of Invention

The power consumption of a specific area in a facility can be determined.

BRIEF DESCRIPTION OF DRAWINGS

FIG. 5 is a diagram illustrating a configuration example of an air conditioning efficiency DB 123.

DESCRIPTION OF EMBODIMENTS

Figure 1:
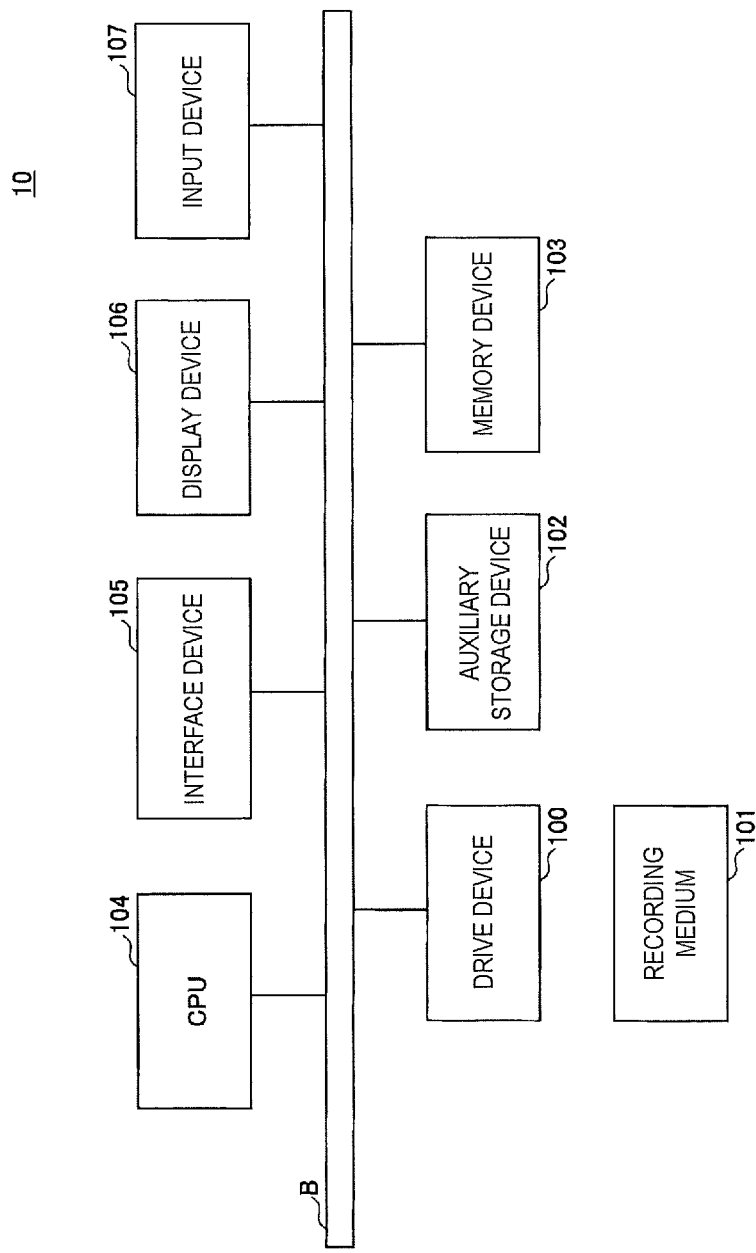
FIG. 1 is a diagram illustrating an example of a hardware configuration of a power consumption calculation apparatus 10 according to an embodiment of the present invention.

Hereinafter, embodiments of the present invention will be described with reference to the drawings. FIG. 1 is a diagram illustrating an example of a hardware configuration of a power consumption calculation apparatus 10 according to an embodiment of the present invention. The power consumption calculation apparatus 10 in FIG. 1 includes a drive device 100, an auxiliary storage device 102, a memory device 103, a CPU 104, an interface device 105, a display device 106, an input device 107, and the like that are connected to each other via a bus B.

A program for implementing processing with the power consumption calculation apparatus 10 is provided by a recording medium 101 such as a CD-ROM. If the recording medium 101 storing the program is set in the drive device 100, the program is installed in the auxiliary storage device 102 from the recording medium 101 via the drive device 100. However, the program is not necessarily installed from the recording medium 101 and may be downloaded from another computer via a network. The auxiliary storage device 102 stores the installed program and also stores required files, data, and the like.

The memory device 103 reads and stores the program from the auxiliary storage device 102 in a case where a command for activating the program is issued. The CPU 104 implements a function related to the power consumption calculation apparatus 10 according to the program stored in the memory device 103. The interface device 105 is used as an interface for establishing connection to a network. The display device 106 displays a graphical user interface (GUI) or the like provided by the program. The input device 107 is configured of a keyboard and a mouse, or the like, and is used to allow for inputs of various operation commands.

Figure 2:
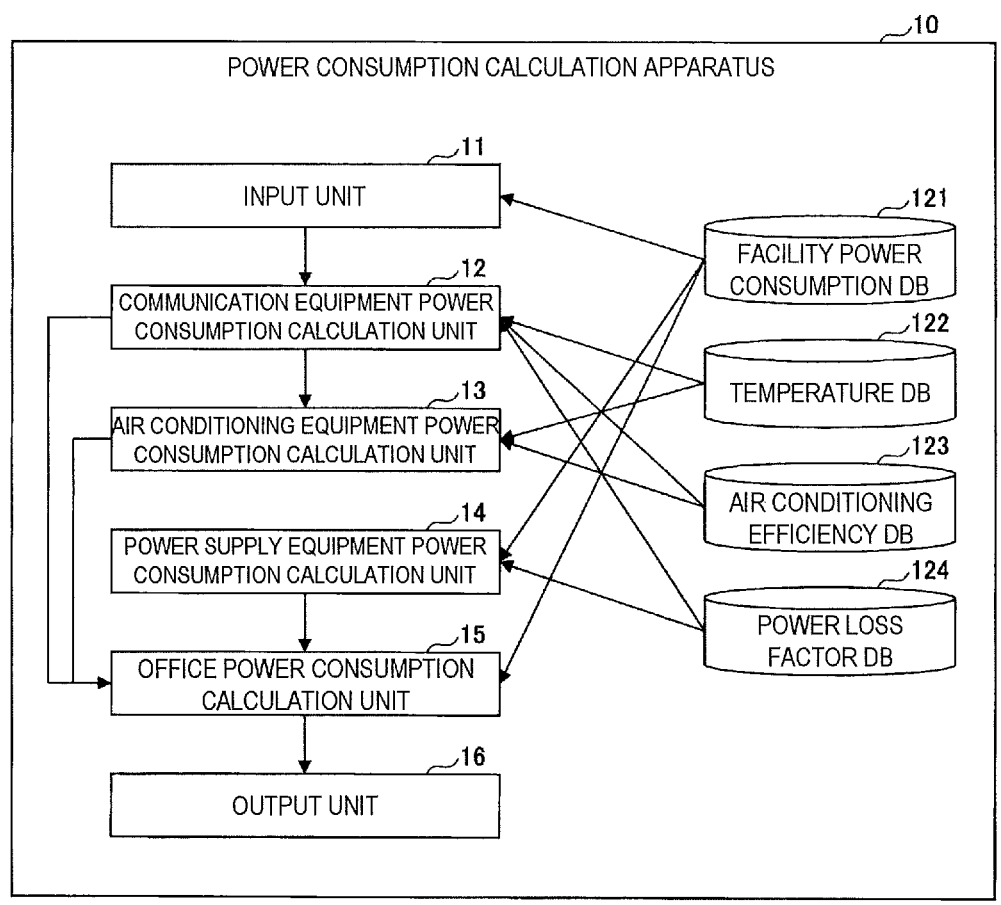
FIG. 2 is a diagram illustrating an example of a functional configuration of the power consumption calculation apparatus 10 according to the embodiment of the present invention.

FIG. 2 is a diagram illustrating an example of a functional configuration of the power consumption calculation apparatus 10 according to the embodiment of the present invention. In FIG. 2, the power consumption calculation apparatus 10 includes an input unit 11, a communication equipment power consumption calculation unit 12, an air conditioning equipment power consumption calculation unit 13, a power supply equipment power consumption calculation unit 14, an office power consumption calculation unit 15, and an output unit 16. Each of these units is implemented by processing that one or more programs installed on the power consumption calculation apparatus 10 cause the CPU 104 to execute. The power consumption calculation apparatus 10 also utilizes databases (storage) such as a facility power consumption DB 121, a temperature DB 122, an air conditioning efficiency DB 123, and a power loss factor DB 124. Each of these databases can be achieved by using, for example, the auxiliary storage device 102 or a storage device or the like connectable to the power consumption calculation apparatus 10 via a network.

The facility power consumption DB 121 records a history of the total power consumption of a facility x (hereinafter referred to as "facility power consumption Wx") measured at a certain facility (hereinafter referred to as "facility x") every predetermined unit time (e.g., a unit time of 1 hour or less, hereinafter referred to as "measurement unit time") for a predetermined period (e.g., 1 year) in the past. The facility x is, for example, a facility such as a data center in which communication equipment (a group of communication devices for providing communication services and the like) is operated, and includes air conditioning equipment for cooling the communication equipment and the like, power supply equipment that distributes supplied power from a commercial use power supply to various types of equipment such as the communication equipment and the air conditioning equipment, and the like. Furthermore, the facility x not only includes an area in which the communication equipment used to provide the communication services is operated (hereinafter referred to as "machine room space"), but also includes other areas (excluding the machine room space) (hereinafter referred to as "office space"). The office space includes, for example, a space for office workers or the like performing their job tasks, and a shared space such as an elevator, a staircase, or the like.

Note that in the present embodiment, the power consumption by the power supply equipment (power supply equipment power consumption) is represented by "Wp", the power consumption by the air conditioning equipment (air conditioning equipment power consumption) is represented by "Wa", and the power consumption by the communication equipment (communication equipment power consumption) is represented by "Wc".

Figure 3:
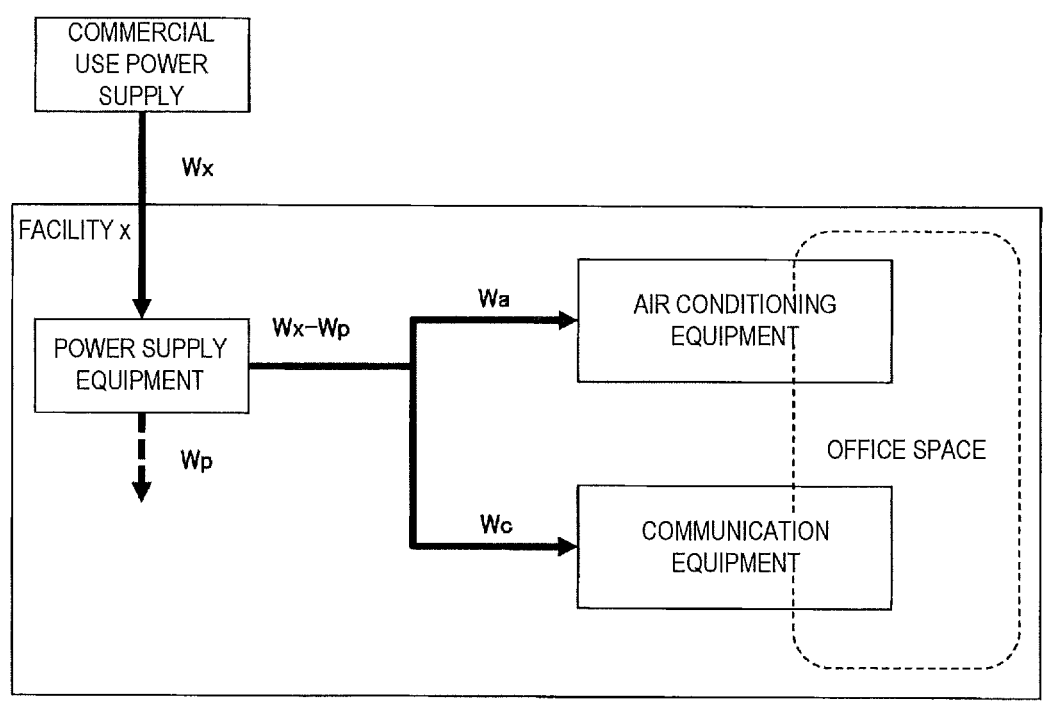
FIG. 3 is a diagram for describing a relation between various types of power consumption according to the present embodiment.

FIG. 3 is a diagram for describing a relation between various types of power consumption according to the present embodiment. As illustrated in FIG. 3, the electricity supply from the commercial use power supply corresponds to the facility power consumption Wx. Since Wp, out of the facility power consumption Wx, is consumed by the power supply equipment, the electricity supply to the air conditioning equipment and the communication equipment is Wx−Wp. Of the Wx−Wp, the amount of electricity supplied to the air conditioning equipment (the power consumption by the air conditioning equipment) is Wa, and the amount of electricity supplied to the communication equipment (the power consumption by the communication equipment) is Wc.

Note that a part of Wa+Wc is consumed by the office space. That is, a part of Wa is consumed by the air conditioning equipment in the office space, and a part of Wc is consumed by the communication equipment in the office space. The communication equipment in the office space does not mean communication equipment used to provide communication services, but means communication equipment utilized for office operations, for example. In the present embodiment, the following relation is satisfied as can be seen from FIG. 3.

$$Wx = Wp + Wa + Wc$$

Reference now returns to FIG. 2. The temperature DB 122 stores a history of the temperature (outside temperature) measured at least at the location of the facility x every unit time (e.g., every hour) for a predetermined period (1 year) in the past.

The air conditioning efficiency DB 123 stores a correspondence table of air conditioning efficiency Ra of the air conditioning equipment relative to the outside temperature. Note that in the present embodiment, the air conditioning efficiency Ra is defined as a ratio of the communication equipment power consumption Wc to the air conditioning equipment power consumption Wa required to cool the communication equipment (i.e., Ra=Wc/Wa). This is derived from the following definition formula of "cooling COP" based on the idea of Coefficient Of Performance (COP):

Cooling COP=Cooling capacity (kw)/Cooling power consumption (kw)

under the assumption that "Cooling capacity" corresponds to the "communication equipment power consumption Wc".

The power loss factor DB 124 stores a power loss factor Rp that is a rate at which Wx is lost (consumed) by the power supply equipment in the facility x. In other words, Wp is expressed by Wx and Rp as follows.

$$Wp = Wx \times Rp$$

Note that in the present embodiment, the power loss factor Rp is assumed to be constant.

The functions of the input unit 11, the communication equipment power consumption calculation unit 12, the air conditioning equipment power consumption calculation unit 13, the power supply equipment power consumption calculation unit 14, the office power consumption calculation unit 15, and the output unit 16 will be apparent in the description of the processing procedure.

Figure 4:
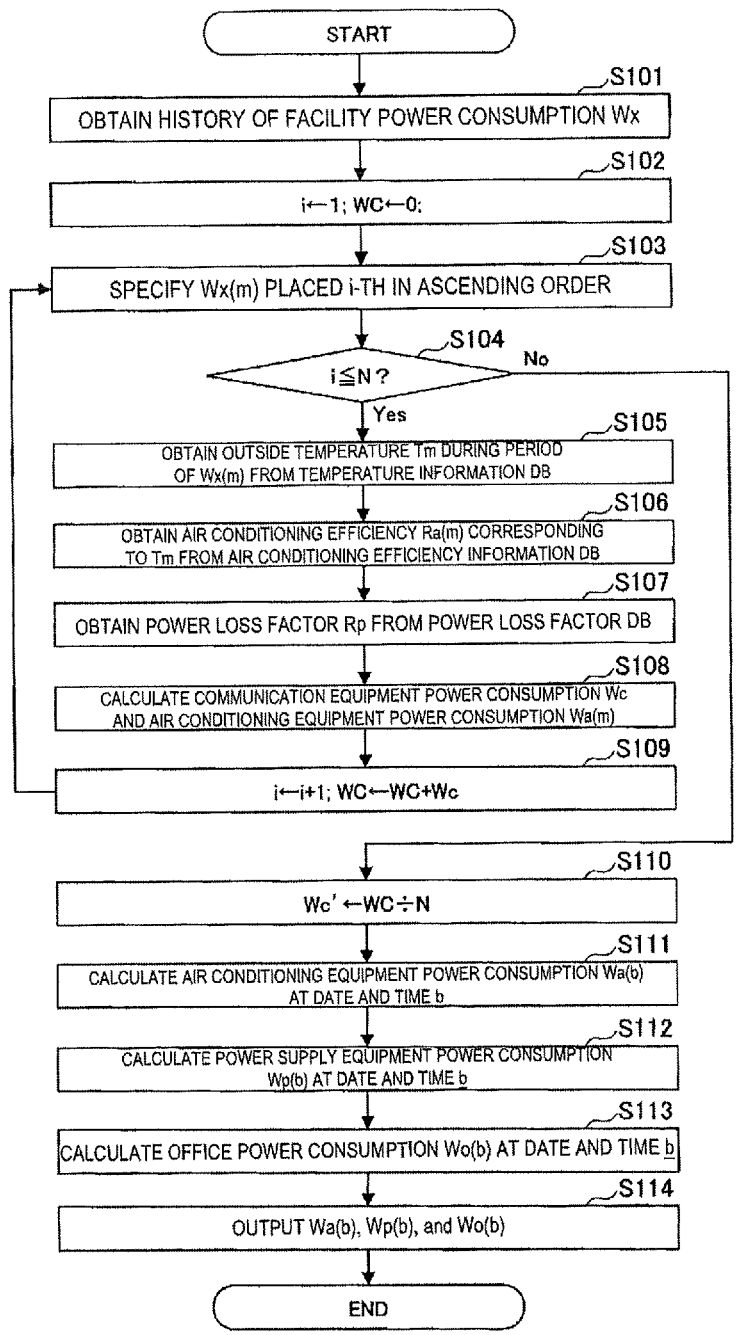
FIG. 4 is a flowchart for describing an example of a processing procedure executed by the power consumption calculation apparatus 10.

The processing procedure executed by the power consumption calculation apparatus 10 will be described below. FIG. 4 is a flowchart for describing an example of the processing procedure executed by the power consumption calculation apparatus 10.

In step S101, the input unit 11 obtains the facility power consumption Wx measured every measurement unit time for a predetermined period, such as one year. In other words, the number of Wx obtained is the same as the number obtained by dividing the predetermined period by the measurement unit time.

Next, the communication equipment power consumption calculation unit 12 substitutes 1 for a variable i and substitutes 0 for a variable WC (S102).

Next, the communication equipment power consumption calculation unit 12 identifies Wx(m) (Wx(m)>0) that is placed the i-th in the ascending order among the obtained Wx group, and substitutes the identified Wx(m) for a variable Wx(m) (S103). Thus, Wx(m) when i=1 is the minimum Wx in the Wx group.

In the present embodiment, Wx(m) is regarded as the power consumption in the machine room space. That is, a period in which Wx is the minimum during a predetermined period, such as one year, is considered to be a period during which a power outage occurs in the facility x due to a statutory inspection of the facility x. While the office space serves as a target area of the power outage, the power outage is not implemented for the machine room space because it is not allowed to stop any communication services during this period. Thus, during the period of Wx(m) the power consumption of the office space can be considered to be 0, and thus Wx(m) can be regarded as the power consumption in the machine room space. It should be noted that from such a point of view, the office space may be considered to be an area where no power is supplied during a statutory inspection (area for which a power outage is implemented).

Next, the communication equipment power consumption calculation unit 12 determines whether i is equal to or less than a threshold N (N>1) (S104). The significance of step S104 will be described later.

When i is equal to or less than the threshold N (Yes in S104), the communication equipment power consumption calculation unit 12 obtains outside temperature Tm during the period of Wx(m) (measurement unit time) from the temperature DB 122 (S105), and obtains the air conditioning efficiency Ra(m) corresponding to Tm from the air conditioning efficiency DB 123 (S106).

FIG. 5 is a diagram illustrating a configuration example of the air conditioning efficiency DB 123. As illustrated in FIG. 5, the air conditioning efficiency DB 123 stores the air conditioning efficiency Ra corresponding to each outside temperature. If a record including an outside temperature that is completely matched to Tm is not stored in the air conditioning efficiency DB 123, it suffices if the air conditioning efficiency Ra of a record including an outside temperature closest to Tm is obtained as Ra(m). Note that the air conditioning efficiency Ra corresponding to the outside temperature may be determined with reference to a catalog value of the air conditioning efficiency of a primarily used air conditioner, or may be determined through an experiment or the like (NPL1).

Next, the communication equipment power consumption calculation unit 12 obtains the power loss factor Rp from the power loss factor DB 124 (S107). Next, the communication equipment power consumption calculation unit 12 calculates the communication equipment power consumption Wc and air conditioning equipment power consumption Wa(m) during the period of Wx(m) using the following formula (S108).

$$Ra(m)=Wc/Wa(m)$$

$$Wc+Wa(m)+(Wx(m) \times Rp)=Wx(m)$$

That is, Wc and Wx(m) can be calculated by substituting Wx(m) identified in step S103, Ra obtained in step S106, and Rp obtained in step S107 in the simultaneous equations above. Note that Wc calculated here is a value during a period in which a power outage is implemented for the office space and is thus regarded as Wc in the machine room space.

Next, the communication equipment power consumption calculation unit 12 adds 1 to the variable i, adds Wc to the variable WC (S109), and repeats step S103 and the subsequent steps.

In this manner, steps S103 to S109 are repeated N times. In step S104, when i exceeds N (No at S109), the communication equipment power consumption calculation unit 12 calculates Wc' by dividing WC by N (S110). That is, Wc' is the average value of Wc calculated in step S108 N times (i.e., Wc based on a part of (N pieces of) Wx from the ascending order). The average value of Wc is calculated in the present embodiment because Wc is assumed to be constant for the predetermined period and Wc' is calculated from a plurality of Wx in the ascending order, so that errors in Wc can be reduced.

In other words, the condition in step S104 is a condition for using a plurality of Wx close to the minimum for the calculation of Wc'. Other conditions that satisfy the foregoing may replace the condition in step S104. For example, whether if the absolute value of the difference between the i-th identified W(m) and the minimum W(m) (i.e., the first identified W(m)) is smaller than a threshold $\alpha$ ($\alpha$>0) is determined, and if the absolute value is smaller than the threshold $\alpha$, step S105 and the subsequent steps may be performed, whereas if the absolute value is equal to or larger than the threshold $\alpha$, step S110 may be performed.

It should be noted that only the minimum Wx(m) may be used. That is, steps S103 to S109 may be performed only once. In this case, the subsequent Wc' is replaced with this Wx(m).

Next, the air conditioning equipment power consumption calculation unit 13 calculates an air conditioning equipment power consumption Wa(b) at a date and time b using the following formula (S111).

$$Wa(b)=Wc'/Ra(b)$$

Here, Wa(b) is based on Wc', and is thus the air conditioning equipment power consumption at the date and time b in the machine room space. Note that the date and time (b) is a period starting at any time point within the predetermined period and having the identical time width as the measurement unit time. For example, the start of the date and time (b) may be specified by the user at the beginning of the processing procedure in FIG. 4 or may be preset. Note that Ra(b) can be identified by obtaining the outside temperature at the date and time (b) from the temperature DB 122 and obtaining the air conditioning efficiency Ra corresponding to the outside temperature from the air conditioning efficiency DB 123.

Next, the power supply equipment power consumption calculation unit 14 calculates a power supply equipment power consumption Wp(b) at the date and time b using the following formula (S112).

$$Wp(b)=Wx(b) \times Rp$$

Next, the office power consumption calculation unit 15 calculates an office power consumption Wo(b) at the date and time b using the following formula (S113).

$$Wo(b)=Wx(b)-Wp(b)-Wa(b)-Wc'$$

In other words, the power consumption at the date and time b in the office space is calculated by subtracting Wp(b), Wa(b) in the machine room space, and Wc' in the machine room space from Wx(b). Note that in the present embodiment, on the assumption that the power supply equipment power consumption Wp is negligibly small in the office space compared with that in the machine room space, all of Wp(b) is regarded as Wp in the machine room space at the date and time b.

Note that the office power consumption calculation unit 15 may calculate a machine room power consumption Wd(b) using the following formula in step S112.

$$Wd(b)=Wp(b)+Wa(b)+Wc'$$

The office power consumption calculation unit 15 may calculate the office power consumption Wo(b) using the following formula after calculating W(d).

$$Wo(b)=Wx(b)-Wd(b)$$

Next, the output unit 16 outputs Wc', Wa(b), Wp(b), and Wo(b). The output form is not limited to predetermined forms. Wc', Wa(b), Wp(b), and Wo(b) may be displayed on the display device 106, may be stored in the auxiliary storage device 102, or may be transmitted via a network. Wd(b) may be output in place of Wa(b) or in addition to Wa(b).

As described above, according to the present embodiment, it is possible to understand the power consumption of a specific area in a facility, such as an office space or a machine room space. As a result, it is possible to enable, for example, visualization of power consumption factors at the facility.

Note that, the air conditioning efficiency DB 123 can be omitted in a case where the communication equipment power consumption Wc is known, such as when communication equipment having the function of measuring the amount of electricity consumed by itself is used.

Note that in the present embodiment, the communication equipment power consumption calculation unit 12 is an example of a first identification unit, a second identification unit, and a first calculation unit. The air conditioning equipment power consumption calculation unit 13, the power supply equipment power consumption calculation unit 14, and the office power consumption calculation unit 15 are examples of a second calculation unit. The office space is an example of a first area. The machine room space is an example of a second area. The period of Wx(m) is an example of a first period. The date and time b are an example of a second period.

While a preferred embodiment of the present invention has been described above, the present invention is not limited to this specific embodiment and can be subjected to various modifications and changes within the scope of the gist of the present invention disclosed in the claims.

REFERENCE SIGNS LIST

10 Power consumption calculation apparatus
11 Input unit
12 Communication equipment power consumption calculation unit
13 Air conditioning equipment power consumption calculation unit
14 Power supply equipment power consumption calculation unit
15 Office power consumption calculation unit
16 Output unit
100 Drive device
101 Recording medium
102 Auxiliary storage device
103 Memory device
104 CPU
105 Interface device
106 Display device
107 Input device
121 Facility power consumption DB
122 Temperature DB
123 Air conditioning efficiency DB
124 Power loss factor DB
B Bus

The invention claimed is:

1. A power consumption calculation apparatus comprising:
a memory; and
a processor that is coupled to the memory and that is configured to
identify, from a history of a total power consumption Wx measured at a facility including power supply equipment, air conditioning equipment, and communication equipment, a part of Wx in an ascending order;
identify, for each identified Wx, an air conditioning efficiency Ra corresponding to a temperature at a location of the facility in a first period in which the Wx is measured;
calculate a power consumption Wc' of the communication equipment in a second area excluding a first area in the facility by applying each Wx and each Ra to a relation Wc+Wa+(Wx×Rp)=Wx where the air conditioning efficiency Ra is a value calculated by dividing the Wc being a power consumption of the communication equipment by the Wa being a power consumption of the air conditioning equipment and the Rp is a loss factor of the Wx by the power supply equipment; and
calculate a power consumption of the first area or the second area based on the Wx corresponding to a second period in the history, the Wc', the Rp, and an air conditioning efficiency Ra' corresponding to the second period,
wherein the facility is a data center,
wherein the second area is a machine room space in which the communication equipment used to provide communication services is operated,
wherein the first area is an office space excluding the machine room space, and
wherein in a period during which a power outage occurs in the facility due to a statutory inspection of the facility, the office space is subject to the power outage but the machine room space is not subject to the power outage.

2. The power consumption calculation apparatus according to claim 1, wherein the processor identifies a plurality of Wx in an ascending order from the history,
the processor calculates an average value of the Wc' calculated based on each Wx identified by the processor, and
the processor calculates the power consumption of the first area or the second area based on the Wx corresponding to the second period in the history, the average value, the Rp, and the air conditioning efficiency Ra' corresponding to the second period.

3. The power consumption calculation apparatus according to claim 1, wherein the processor calculates the power consumption of the first area or the second area based on relations:

$$Wa=Wc/Ra,$$

$$Wp=Wx\times Rp, \text{ and}$$

$$Wo=Wx-Wp-Wa-Wc'$$

where the Wp is a power consumption by the power supply equipment and the Wo is a power consumption of the first area.

4. A power consumption calculation method implemented by a computer, the method comprising:
first identifying, from a history of a total power consumption Wx measured at a facility including power supply equipment, air conditioning equipment, and communication equipment, a part of Wx in an ascending order;

second identifying, for each identified Wx, an air conditioning efficiency Ra corresponding to a temperature at a location of the facility in a first period in which the Wx is measured;

first calculating a power consumption Wc' of the communication equipment in a second area excluding a first area in the facility by applying each Wx identified in the first identifying and each Ra identified in the second identifying to a relation Wc+Wa+(Wx×Rp)=Wx where the air conditioning efficiency Ra is a value calculated by dividing the Wc being a power consumption of the communication equipment by the Wa being a power consumption of the air conditioning equipment and the Rp is a loss factor of the Wx by the power supply equipment; and second calculating a power consumption of the first area or the second area based on the Wx corresponding to a second period in the history, the Wc', the Rp, and an air conditioning efficiency Ra' corresponding to the second period, wherein the facility is a data center, wherein the second area is a machine room space in which the communication equipment used to provide communication services is operated, wherein the first area is an office space excluding the machine room space, and wherein in a period during which a power outage occurs in the facility due to a statutory inspection of the facility, the office space is subject to the power outage but the machine room space is not subject to the power outage.

5. The power consumption calculation method according to claim 4, wherein the first identifying includes identifying a plurality of Wx in an ascending order from the history, the first calculating includes calculating an average value of the Wc' calculated based on each Wx identified in the first identifying, and the second calculating includes calculating the power consumption of the first area or the second area based on the Wx corresponding to the second period in the history, the average value, the Rp, and the air conditioning efficiency Ra' corresponding to the second period.

6. The power consumption calculation method according to claim 4, wherein the second calculating includes calculating the power consumption of the first area or the second area based on relations:

$$Wa = Wc/Ra,$$

$$Wp = Wx \times Rp, \text{ and}$$

$$Wo = Wx - Wp - Wa - Wc'$$

where the Wp is a power consumption by the power supply equipment and the Wo is a power consumption of the first area.

7. A non-transitory computer-readable recording medium having stored therein a program for causing a computer to execute the power consumption calculation method according to claim 4.

* * * * *